United States Patent
Verma et al.

(10) Patent No.: US 10,546,083 B1
(45) Date of Patent: Jan. 28, 2020

(54) SYSTEM, METHOD, AND COMPUTER PROGRAM PRODUCT FOR IMPROVING COVERAGE ACCURACY IN FORMAL VERIFICATION

(71) Applicant: Cadence Design Systems, Inc., San Jose, CA (US)

(72) Inventors: Amit Verma, Uttar Pradesh (IN); Suyash Kumar, Uttar Pradesh (IN); Habeeb Farah, Nazareth (IL)

(73) Assignee: Cadence Design Systems, Inc., San Jose, CA (US)

( * ) Notice: Subject to any disclaimer, the term of this patent is extended or adjusted under 35 U.S.C. 154(b) by 1 day.

(21) Appl. No.: 15/591,293

(22) Filed: May 10, 2017

(51) Int. Cl.
*G06F 17/50* (2006.01)
*H01L 27/02* (2006.01)

(52) U.S. Cl.
CPC ........ *G06F 17/504* (2013.01); *G06F 17/5022* (2013.01); *G06F 17/5036* (2013.01); *G06F 17/505* (2013.01); *G06F 17/5045* (2013.01); *G06F 17/5081* (2013.01); *H01L 27/0207* (2013.01)

(58) Field of Classification Search
CPC .............. G06F 17/504; G06F 17/5081; G06F 17/5045; G06F 17/505; G06F 17/5022; G06F 17/5036; H01L 27/0207
See application file for complete search history.

(56) References Cited

U.S. PATENT DOCUMENTS

| | | | | |
|---|---|---|---|---|
| 7,437,694 B1 * | 10/2008 | Loh | ...... | G06F 17/5022 716/136 |
| 7,836,416 B2 * | 11/2010 | Schubert | ...... | G06F 17/504 703/13 |
| 8,166,430 B2 * | 4/2012 | Bormann | ...... | G06F 17/5081 703/16 |
| 8,219,947 B2 * | 7/2012 | Bist | ...... | G06F 17/5022 703/14 |
| 8,826,201 B1 * | 9/2014 | Hanna | ...... | G06F 17/5045 716/104 |
| 8,904,319 B2 * | 12/2014 | Bist | ...... | G06F 17/5022 716/100 |
| 2015/0135150 A1 | 5/2015 | Hanna et al. | | |
| 2018/0121341 A1 * | 5/2018 | Guralnik | ...... | G06F 11/3692 |

* cited by examiner

*Primary Examiner* — Helen Rossoshek
(74) *Attorney, Agent, or Firm* — Mark H. Whittenberger, Esq.; Holland & Knight LLP

(57) ABSTRACT

The present disclosure relates to a method for electronic design verification. Embodiments may include receiving, using at least one processor, an electronic design and automatically identifying one or more code coverage points from a netlist of an original model associated with the electronic design. Embodiments may include receiving a property and one or more elements, each of the one or more elements corresponding to one of the one or more code coverage points. Embodiments may further include performing model checking based upon, at least in part, the property and the one or more elements. Embodiments may also include verifying the property and generating an unsatisfiability core based upon, at least in part, the one or more elements.

18 Claims, 16 Drawing Sheets

```
000  module shift(a, clk, rst);
001  input a, clk, rst;
002  reg [4:0] state;                          102B
003
004  wire w0 = state[0];
005  wire w1 = state[1];
006  wire w2 = state[2];
007  wire w3 = state[3];              104B
008
009  always @(posedge clk)
010  begin
011     if (rst)
012        state <= 5'b00000;
013     else
014        begin
015           state[0] <= a;           106B
016
017           state[1] <= w0;
018           state[2] <= w1;
019           state[3] <= w2 || w1;
020
021           state[4] <= w3;
022        end
023  end
024  endmodule
```

FIG. 1B

```
reg [1:0] light1;
reg [1:0] action1, action2, action3, action4, action5, action;
always @(posedge clk)
    case (light1)
        2'b00 : action = 2'b01;
        2'b01 : action = 2'b10;
        2'b10 : action = 2'b11;
        2'b11 : action = 2'b00;
        default : action = 2'b01;
    endcase CO1_PROP: assert property (@(posedge clk) ((light1 == 2'b01) |=> action == 2'b10));
```

FIG. 4

```
reg [1:0] light1;
reg [1:0] action1, action2, action3, action4, action5, action;

always @(posedge clk)
    case (light1)
        2'b00 : action = 2'b01;
        2'b01 : action = 2'b10;
        2'b10 : action = 2'b11;
        2'b11 : action = 2'b00;
        default : action = 2'b01;
    endcase CO1_PROP: assert property (@(posedge clk) ((light1 == 2'b01) |=> action == 2'b10));
```

FIG. 5

```
reg [1:0] light1;
reg [1:0] action, action1, action2, action3, action4,action,action5, action;

always @(posedge clk)
   action1 = 2'b01;
always @(posedge clk)
   action2 = 2'b10;
always @(posedge clk)
   action3 = 2'b11;
always @(posedge clk)
   action4 = 2'b00;
always @(posedge clk)
   action5 = 2'b01;
always @(posedge clk)
   case (light1)
      2'b00: action = action1;
      2'b01: action = action2;
      2'b10: action = action3;
      2'b11: action = action4;
      default: action = action5;
   endcase COI_PROP: assert property (@(posedge clk) ((light1 == 2'b00) |=> action == 2'b10));
endmodule
```

```
always@(posedge clk)
  begin
    case (light1)
      //2'b00 : action1 = 2'b01;  // prune one branch
      2'b01 : action1 = 2'b10;
      2'b10 : action1 = 2'b11;
      2'b11 : action1 = 2'b01;
      default : action1 = 2'b01;
    endcase
  end
always@(posedge clk)
  begin
    case (light1)
      //2'b00 : action1 = 2'b01;  // prune one branch
      //2'b01 : action1 = 2'b10;  // prune one branch
      2'b10 : action1 = 2'b11;
      2'b11 : action1 = 2'b01;
      default : action1 = 2'b01;
    endcase
  end
always@(posedge clk)
  begin
    case (light1)
      //2'b00 : action1 = 2'b01;  // prune one branch
      2'b01 : action1 = 2'b10;
      //2'b10 : action1 = 2'b11;  // prune another branch
      2'b11 : action1 = 2'b01;
      default : action1 = 2'b01;
    endcase
  end
```

```
always @(posedge clk or posedge rst) begin
  if(rst)
      line_8_elem = 0;
  else
      line_8_elem = line_8_elem ^ data_line8;
end
always @(posedge clk or posedge rst) begin
  if(rst)
      line_9_elem = 0;
  else
      line_9_elem = line_9_elem ^ data_line9;
end
lways @(posedge clk or posedge rst) begin
  if(rst)
      line_10_elem = 0;
  else
      line_10_elem = line_10_elem ^ data_line10;
end
lways @(posedge clk or posedge rst) begin
  if(rst)
      line_11_elem = 0;
  else
      line_11_elem = line_11_elem ^ data_line11;
end
lways @(posedge clk or posedge rst) begin
  if(rst)
      line_12_elem = 0;
  else
      line_12_elem = line_12_elem ^ data_line12;
end always @(posedge clk)
    case (light1)
        2'b00 : action = line_8_elem == 0 ? 2'b01 : 2'bxx;
        2'b01 : action = line_9_elem == 0 ? 2'b10 : 2'bxx;
        2'b10 : action = line_10_elem == 0 ? 2'b11 : 2'bxx;
        2'b11 : action = line_11_elem == 0 ? 2'b00 : 2'bxx;
        default : action = line_12_elem == 0 ? 2'b01 : 2'bxx;
    endcase COI_PROP: assert property (@(posedge clk) ((light1 == 2'b01) |=> action == 2'b10));
```

New element →

FIG. 10

```
1300 always @(posedge clk)
    case (light1)
        2'b00 : action = 2'b01;
        2'b01 : action = 2'b10;
        2'b10 : action = 2'b11;
        2'b11 : action = 2'b00;
        default : action = 2'b01;
    endcase COL_PROP: assert property (@(posedge clk) ((light1 == 2'b01) |=> action == 2'b10));
```

FIG. 13

SYSTEM, METHOD, AND COMPUTER PROGRAM PRODUCT FOR IMPROVING COVERAGE ACCURACY IN FORMAL VERIFICATION

FIELD OF THE INVENTION

This disclosure relates generally to formal verification of circuit designs, and more specifically to formal verification coverage metrics for formal verification of circuit designs.

DISCUSSION OF THE RELATED ART

Over the last 30 years, the complexity of integrated circuits has increased greatly. This increase in complexity has exacerbated the difficulty of verifying circuit designs. In a typical integrated circuit design process, which includes many steps, the verification step consumes approximately 70-80% of the total time and resources. Aspects of the circuit design such as time-to-market and profit margin greatly depend on the verification step. As a result, flaws in the design that are not found during the verification step can have significant economic impact by increasing time-to-market and reducing profit margins.

As the complexity in circuit design has increased, there has been a corresponding improvement in various kinds of verification and debugging techniques. In fact, these verification and debugging techniques have evolved from relatively simple transistor circuit-level simulation (in the early 1970s) to logic gate-level simulation (in the late 1980s) to the current art that uses Register Transfer Language (RTL)-level simulation. RTL describes the registers of a computer or digital electronic system and the way in which data are transferred among them.

Existing verification and debugging tools are used in the design flow of a circuit. The design flow begins with the creation of a circuit design at the RTL level using RTL source code. The RTL source code is specified according to a Hardware Description Language (HDL), such as Verilog HDL or VHDL. Circuit designers use high-level hardware description languages because of the size and complexity of modern integrated circuits. Circuit designs are developed in a high-level language using computer-implemented software applications, which enable a user to use text-editing and graphical design tools to create a HDL-based design.

In the design flow, creation of the RTL source code is followed by verification of the design to check if the RTL source code meets various design specifications. Formal verification is one such technique for verifying the circuit design. Formal verification uses mathematical techniques to prove that, under a set of constraints, a design property is either always correct or to provide an example condition (called a counterexample) that demonstrates the property is false. Tools that use formal methods to verify RTL source code and design properties are known as "model checkers." Design properties to be verified include specifications and/or requirements that must be satisfied by the circuit design. Since mathematical properties define the design requirements in pure mathematical terms, this enables analysis of all possible valid inputs for a given circuit and is akin to an exhaustive simulation.

The effectiveness of formal verification depends on the completeness of the property set that is used to verify the circuit design. The property set should be sufficient to provide test coverage for a large portion of the circuit design. The degree to which the circuit design is tested with the property set during formal verification is quantified with a coverage metric. A low coverage metric indicates that more properties are needed to properly test the circuit design, whereas a high coverage metric indicates that the current property set is sufficient. However, existing coverage metrics overestimate the coverage of a property set and mislead the circuit designer into believing that the current property set provides sufficient test coverage during formal verification when it actually does not.

SUMMARY OF DISCLOSURE

In one or more embodiments of the present disclosure, a computer-implemented method for electronic design verification. The method may include receiving, using at least one processor, an electronic design and automatically identifying one or more code coverage points from a netlist of an original model associated with the electronic design. The method may include receiving a property and one or more elements, each of the one or more elements corresponding to one of the one or more code coverage points. The method may further include performing model checking based upon, at least in part, the property and the one or more elements. The method may also include verifying the property and generating an unsatisfiability core based upon, at least in part, the one or more elements.

One or more of the following features may be included. In some embodiments, the one or more elements are at a branch level, an expression level, a gate level, and/or a block level. The method may further include displaying at least a portion of the unsatisfiability core at a graphical user interface. The method may also include linking at least a portion of the unsatisfiability core with the one or more code coverage points.

In one or more embodiments of the present disclosure a computer-readable storage medium having stored thereon instructions, which when executed by a processor result in one or more operations is provided. Operations may include receiving, using at least one processor, an electronic design and automatically identifying one or more code coverage points from a netlist of an original model associated with the electronic design. Operations may include receiving a property and one or more elements, each of the one or more elements corresponding to one of the one or more code coverage points. Operations may further include performing model checking based upon, at least in part, the property and the one or more elements. Operations may also include verifying the property and generating an unsatisfiability core based upon, at least in part, the one or more elements.

One or more of the following features may be included. In some embodiments, the one or more elements are at a branch level, an expression level, a gate level, and/or a block level. Operations may further include displaying at least a portion of the unsatisfiability core at a graphical user interface. Operations may also include linking at least a portion of the unsatisfiability core with the one or more code coverage points.

In one or more embodiments of the present disclosure, a system for electronic design verification is provided. The system may include one or more processors configured to receive an electronic design and automatically identify one or more code coverage points from a netlist of an original model associated with the electronic design. The at least one processor may be further configured to receive a property and one or more elements, each of the one or more elements corresponding to one of the one or more code coverage points. The at least one processor may be configured to perform model checking based upon, at least in part, the property and the one or more elements. The at least one processor may be further configured to verify the property and generate an unsatisfiability core based upon, at least in part, the one or more elements.

One or more of the following features may be included. In some embodiments, the one or more elements are at a branch level, an expression level, a gate level, and/or a block level. The at least one processor may be further configured to display at least a portion of the unsatisfiability core at a graphical user interface.

Additional features and advantages of embodiments of the present disclosure will be set forth in the description which follows, and in part will be apparent from the description, or may be learned by practice of embodiments of the present disclosure. The objectives and other advantages of the embodiments of the present disclosure may be realized and attained by the structure particularly pointed out in the written description and claims hereof as well as the appended drawings.

It is to be understood that both the foregoing general description and the following detailed description are exemplary and explanatory and are intended to provide further explanation of embodiments of the invention as claimed.

BRIEF DESCRIPTION OF THE DRAWINGS

The accompanying drawings, which are included to provide a further understanding of embodiments of the present disclosure and are incorporated in and constitute a part of this specification, illustrate embodiments of the present disclosure and together with the description serve to explain the principles of embodiments of the present disclosure.

FIG. 1B is a RTL description of the circuit design of FIG. 1A that can be verified during formal verification, according to an embodiment.

FIG. 4 is a diagram depicting a formal coverage report in accordance with an embodiment of the present disclosure.

FIG. 5 is a diagram depicting a formal coverage report in accordance with an embodiment of the present disclosure.

FIG. 7 is a diagram depicting a formal coverage report in accordance with an embodiment of the present disclosure.

FIG. 9 is a diagram depicting a formal coverage report in accordance with an embodiment of the present disclosure.

FIG. 10 is a diagram depicting an embodiment in accordance with the present disclosure.

FIG. 13 is a diagram depicting an embodiment in accordance with the present disclosure.

DETAILED DESCRIPTION

Figure 1A:
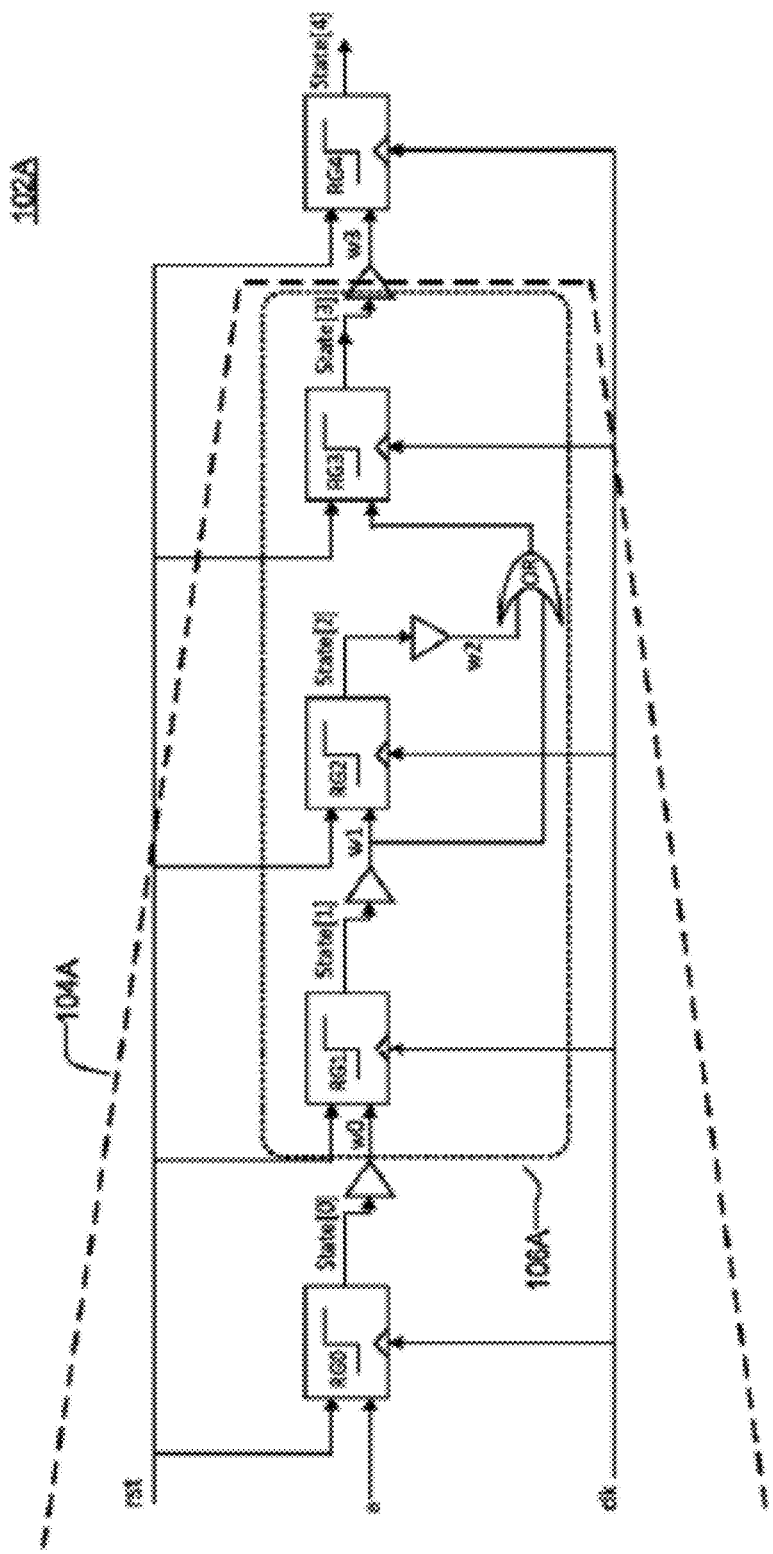
FIG. 1A is a gate level representation of a circuit design that can be verified during formal verification, according to an embodiment.

Reference will now be made in detail to the embodiments of the present disclosure, examples of which are illustrated in the accompanying drawings. The present disclosure may, however, be embodied in many different forms and should not be construed as being limited to the embodiments set forth herein. Rather, these embodiments are provided so that this disclosure will be thorough and complete, and will fully convey the concept of the disclosure to those skilled in the art.

As will be appreciated by one skilled in the art, the present disclosure may be embodied as a method, system, or computer program product. Accordingly, the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present disclosure may take the form of a computer program product on a computer-usable storage medium having computer-usable program code embodied in the medium.

As used in any embodiment described herein, "circuitry" may include, for example, singly or in any combination, hardwired circuitry, programmable circuitry, state machine circuitry, and/or firmware that stores instructions executed by programmable circuitry. It should be understood at the outset that any of the operations and/or operative components described in any embodiment herein may be implemented in software, firmware, hardwired circuitry and/or any combination thereof.

Any suitable computer usable or computer readable medium may be utilized. The computer readable medium may be a computer readable signal medium or a computer readable storage medium. A computer-usable, or computer-readable, storage medium (including a storage device associated with a computing device or client electronic device) may be, for example, but not limited to, an electronic, magnetic, optical, electromagnetic, infrared, or semiconductor system, apparatus, or device, or any suitable combination of the foregoing. More specific examples (a non-exhaustive list) of the computer-readable medium may include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device. In the context of this document, a computer-usable, or computer-readable, storage medium may be any tangible medium that can contain, or store a program for use by or in connection with the instruction execution system, apparatus, or device.

A computer readable signal medium may include a propagated data signal with computer readable program coded embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations of the present invention may be written in an object oriented programming language such as Java, Smalltalk, C++ or the like. However, the computer program code for carrying out operations of the present invention may also be written in conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through a local area network (LAN) or a wide area network (WAN), or the connection may be made to an external computer (for example, through the Internet using an Internet Service Provider).

The present disclosure is described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable memory that can direct a computer or other programmable data processing apparatus to function in a particular manner, such that the instructions stored in the computer-readable memory produce an article of manufacture including instructions which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks.

One or more hardware description languages may be used in accordance with the present disclosure. Some hardware description languages may include, but are not limited to, Verilog, VHDL, SystemC, SystemVerilog and Verilog-AMS. Various other hardware description languages may also be used as well.

To improve the quality of formal verification coverage metrics for circuit designs, embodiments of the present disclosure leverage the idea of a proof core in generating coverage metrics. In one embodiment, a computer-implemented method for circuit design verification comprises performing formal verification on a circuit design to prove a correctness of a property of the circuit design. The circuit design has a cone of influence representing a portion of the circuit design capable of affecting signals of the property. A proof core of the circuit design is identified, the proof core being a portion of the cone of influence that is sufficient to prove the correctness of the property. A coverage metric is generated that is indicative of a level of formal verification coverage provided by the property based on the proof core of the circuit design.

The coverage metric generated using the disclosed method more accurately represents the true level of formal verification coverage associated with a property. The coverage metric can be generated using any one of a number of coverage models, such as with statement coverage models, branch coverage models, and expression coverage models. The property may also be presented on a display to a circuit designer for further review so that the circuit designer is aware of whether more properties are needed to sufficiently test the circuit design.

The Figures (FIG.) and the following description relate to preferred embodiments of the present disclosure by way of illustration only. It should be noted that from the following discussion, alternative embodiments of the structures and methods disclosed herein will be readily recognized as viable alternatives that may be employed without departing from the principles of the present disclosure.

Reference will now be made in detail to several embodiments of the present disclosure(s), examples of which are illustrated in the accompanying figures. It is noted that wherever practicable similar or like reference numbers may be used in the figures and may indicate similar or like functionality. The figures depict embodiments of the present disclosure for purposes of illustration only. One skilled in the art will readily recognize from the following description that alternative embodiments of the structures and methods illustrated herein may be employed without departing from the principles of the disclosure described herein.

Embodiments of the present disclosure describe a formal verification system that generates more accurate formal verification coverage metrics for a circuit design. The formal verification system performs formal verification on a property to prove a correctness of the property. The property can have a cone of influence in the circuit design. A proof core is identified, which is a portion of the cone of influence that is sufficient to prove a correctness of the property P. Using the proof core, a coverage metric is generated for the circuit design that represents an amount of formal verification coverage provided by the property.

FIG. 1A is a gate level representation 102A of a circuit design that can be verified during formal verification, according to an embodiment. FIG. 1A is a simple example of a circuit design that is included for the purposes of illustration only. In other embodiments, the circuit design may have different logic elements than that shown in FIG. 1A. Additionally, the circuit design may have many more logic elements than that shown in FIG. 1A.

The circuit design of FIG. 1A is a shift-register that includes a chain of five registers RG[0:4]. There are also logic elements (buffers, OR gates) between the output of one register RG and the input of the next register RG that control the propagation of data from one register RG to the next. The circuit design includes three signal inputs: "rst", "a", and "clk". The "rst" signal is connected to a reset input of each register RG and resets all of the registers RG when asserted. The "clk" signal is connected to a clock input of each register RG and controls the timing of data propagation through the registers RG. The "a" signal includes input data that is to be shifted through the registers RG.

During formal verification, the circuit design is tested by attempting to prove the correctness of a property that has been written for the circuit design. A property is a specification or requirement that is to be satisfied by the circuit design and can describe a behavioral relationship between signals of the circuit design. An example of a property that can be verified during formal verification is the following property: state[2]|=>state[3] (Property P) Property P includes two parameters: state[2] and state[3]. Property P means that when signal state[2] is logic 1 in a clock cycle, signal state[3] should also be logic 1 in the next immediate clock cycle.

Property P has a cone of influence (COI) 104A in the circuit design that includes portions of the circuit design capable of structurally affecting the signals of property P. As shown in FIG. 1A, the COI 104A includes registers RG[0:3], signals state[0:3], rst, a, clk and w[0:2], as well as most of the logic elements. The COI 104A of property P includes two registers RG2 and RG3 because these components directly generate the signals state[2] and state [3] that are specified by the property P. The COI 104A also includes components and signals in the fan-in of registers RG2 and RG3, such as the rst and clk signals. The fan-in of each component can be traced backwards to establish the full COI 104A of property P.

Portions of the circuit design that are not in the recursive fan-in of the signals of property P are not within the COI 104A. For example, register RG4 is not within the COI 104A. This is because register RG4 only generates the state [4] signal that serves as an output of the circuit design and cannot affect the value of the state[2] or state[3] signals.

Property P also has a proof core 106A in the circuit design. The proof core 106A is a portion of the COI 104A that is sufficient for proving the correctness of property P during formal verification. As shown in FIG. 1A, the proof core 106A for property P includes registers RG[1:3], signals state[1:3] and w[0:2], input signals clk and rst, as well as some logic elements. The circuitry and signals within the proof core 106A are sufficient for proving the correctness of property P. The circuitry and signals outside of the proof core 106A, such as register RGO and signal state[0], are not needed for proving property P. This is because whenever the state[2] signal becomes a logic "1", only the circuit elements between the state[2] and state [3] signals (e.g. OR gate and buffer RG3) can affect whether the state[3] signal becomes logic "1" in the next clock cycle. By contrast, the status of the state[0] signal does not affect whether state[3] will change to logic "1" in the next clock cycle and can only affect whether the state[1] signal changes to logic "1" in the next clock cycle.

In one embodiment, proof core 106A is a portion of the COI 104A that is minimally sufficient for proving the property P. A minimally sufficient proof core 106A includes only portions or part of the circuit design that are both sufficient and necessary for proving a property P. For example, the proof core 106A shown in FIG. 1A is sufficient for proving the property P but is not minimally sufficient. A minimally sufficient proof core 106A would only include registers RG[2:3], signals state[2:3] and w2, input signals rst and clk, the OR gate, and the buffer between state[2] and w2. Signal w1 is not needed to prove the property P because the OR gate will always output a value of "1" when the state[2] signal is logic "1".

FIG. 1B is a RTL description 102B of the circuit design of FIG. 1A, according to an embodiment. The RTL description 102B includes several lines of code statements that describe the behavior of the circuit design. When synthesized, the RTL description 102B of FIG. 1B results in the gate level representation 102A of FIG. 1A.

Portions of the RTL description 102B can be traced to their equivalent circuitry from the gate level representation 102A. Statements 009-019 of the RTL description 102B result in the circuitry found inside the COI 104A of the gate level representation 102A. Statements 009-019 thus form the COI 104B at the RTL level. Statements 017-019 of the RTL description 102B result in the circuitry found inside the proof core 106A of the gate level representation 102A. Statements 017-019 thus form the proof core 106B at the RTL level. Note that the RTL level proof core 106B makes certain assumptions, such as assuming the circuit design is in a post-reset condition so that the rst signal can be ignored and also assuming that the registers will be triggered every cycle so that clk signal can be ignored. In other embodiments, the RTL level proof core 106B may include a different number of RTL statements. For the purposes of this description, COI 104 may used to refer to any representation of the COI at any level of abstraction, and the proof core 106 can refer to any representation of the proof core at any level of abstraction.

Embodiments of the present disclosure use the proof core 106 to generate a coverage metric that indicates a level of formal verification coverage provided by a property. For example, the coverage metric may be a ratio of code statements that are in the RTL proof core 106B to all of the code statements in the RTL description 102B. Conventional coverage metrics rely only on the COI 104 to measure coverage, which results in coverage metrics that overestimate the amount of coverage provided by a property. By narrowing the COI 104 down to a proof core 106 and leveraging the proof core 106 in generating the coverage metric, the coverage metric of the present disclosure more accurately represents how much of the circuit design is actually being tested by a particular property P.

Figure 2:
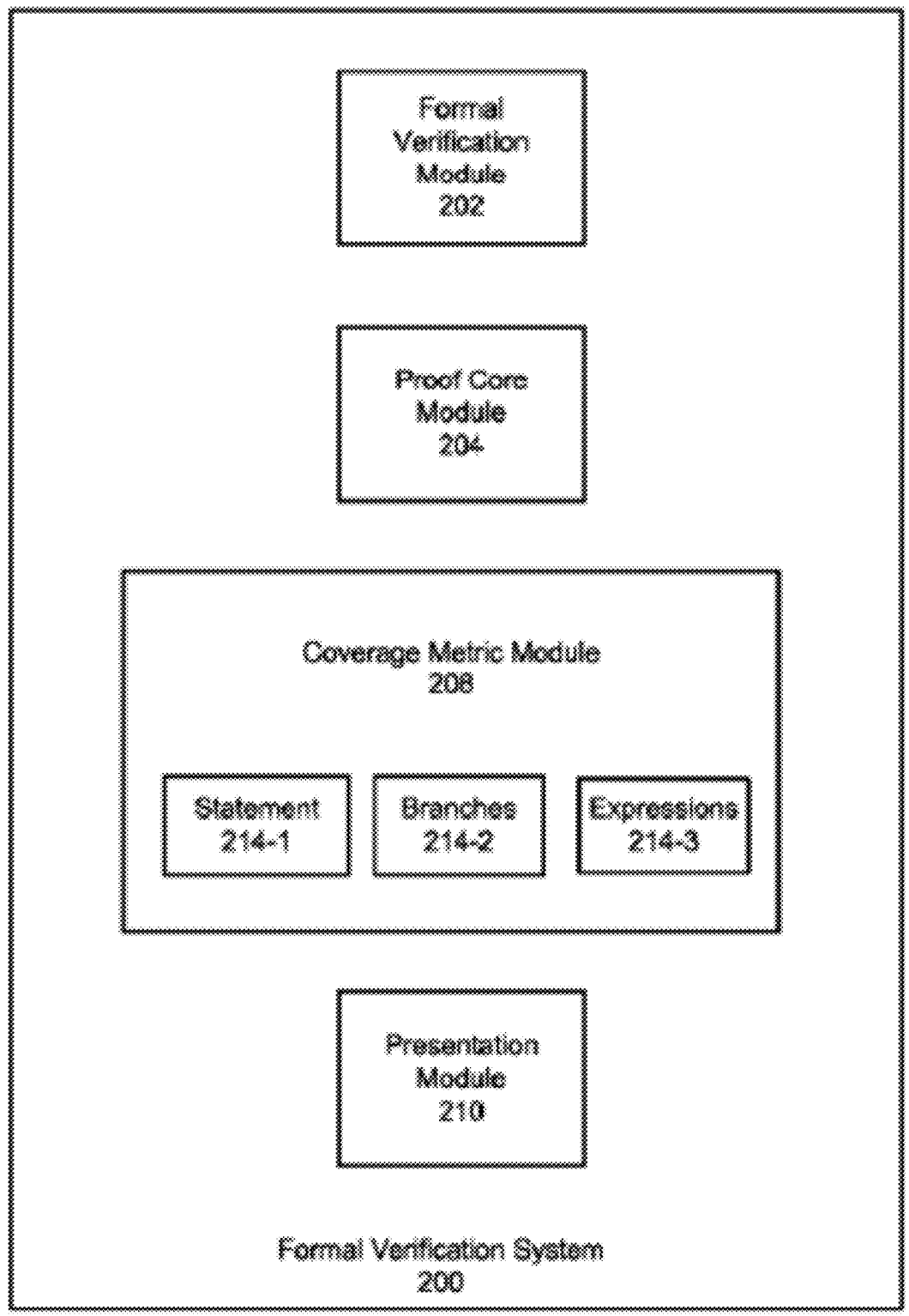
FIG. 2 is formal verification system for evaluating formal verification coverage of a circuit design, according to an embodiment.

FIG. 2 is formal verification system 200 for evaluating verification coverage of a circuit design, according to an embodiment. As shown, formal verification system 200 includes a formal verification module 202, a proof core module 204, a coverage metric module 208 and a presentation module 210. In one embodiment, the verification system 200 may be a computer and the modules are processor executable software instructions stored on a non-transitory computer readable medium of the computer.

Formal verification module 202 performs a formal verification of a circuit design using a set of properties and a set of signal constraints. Formal verification uses mathematical techniques to either prove that, under a set of constraints, each property in the set of properties is always correct or to provide an example condition (called a counterexample) that demonstrates the property is false. The counterexample can be a trace of signal inputs that cause the property to be false. In one embodiment, the formal verification module 202 is able to successfully prove that properties in the set of properties are always correct before providing the properties to the proof core module 204.

In one embodiment, the formal verification module 202 accesses a RTL description 102B of the circuit design, which may be written in HDL or other appropriate language. The formal verification module 202 converts the RTL description 102B into a format that is appropriate for formal verification. In one embodiment, the set of properties to be proven during formal verification may be embedded in the RTL description 102B or stored in a file that is separate from the RTL description 102B. The properties may also be assertions that are described in an assertion based verification language, such as System Verilog Assertion (SVA) or Property Specification Language (PSL).

The proof core module 204 identifies a proof core 106 for the set of properties verified as correct by the formal verification module 202. The proof core 106 is a portion of the COI 104A that is sufficient for proving the properties to be correct during formal verification. The computation of the proof core 106A also accounts for any signal constraints that were applied during formal verification.

In one embodiment, the proof core module 204 first identifies a gate level proof core 106A in the form of a gate level netlist that includes circuit elements and I or signals. The proof core module 204 then identifies a RTL level proof core 106B from the gate level proof core 106A. More specifically, the proof core 106 is computed using a satisfiability (SAT)-based model-checking algorithms using unsatisfiable core generation techniques. One example of such a technique is described in A Scalable Algorithm for Minimal Unsatisfiable Core Extraction, by Nachu, Dershowitz, Ziyad Hanna, and Alexander Nadel, 36-41 2006 SAT Conference, which is hereby incorporated by reference in its entirety.

Generally, a circuit design and property are synthesized into a gate level netlist and represented in conjunctive normal form (CNF). Proving the correctness of the property on a design is equivalent to proving that the CNF representation is not satisfiable (UNSAT), which means there do not exist assignments (or values) for the variables (e.g. flip flops and inputs) of the circuit design that makes the property false. It is known that if the CNF representation is UNSAT, there exists a subset of the formula (in CNF format) that is UNSAT too (in the worst case the subset is equal to the entire CNF). Such a subset can be called an UNSAT core, which is sufficient to prove that the property P is true. The proof core module 204 translates the property P and the circuit design into a gate level netlist, then to CNF. The proof core module 204 proves that the CNF is UNSAT, and then computes the UNSAT core.

The proof core module 204 then lifts the UNSAT core to the original circuit design by mapping the variables in the CNF representation to the gate level to identify the UNSAT core at the gate level, and then maps the gate level UNSAT core to RTL to identify the UNSAT core at the RTL. This is a book-keeping process that maintains the name correspondence between inputs and registers in the RTL description 102B to the gate level representation 102A and the CNF variables. The resulted structure of the UNSAT core at the gate level becomes the gate level proof core 106A and the UNSAT core at the RTL description level becomes the RTL description proof core 106B.

The coverage metric module 208 generates a coverage metric that indicates a level of formal verification coverage provided by the set of properties that were tested during formal verification. A variety of different coverage models 214 can be used in generating the coverage metric. A coverage model 214 is a set of cover items, where each cover item represents an implicit or explicit event in the circuit design that is to be covered by the circuit design. For a given coverage model 214, an intersection between the cover items in the coverage model 214 and the RTL statements in the RTL proof core 106B is first determined in order to identify those cover items that are within the RTL proof core 106B. The coverage is then computed as a percentage of the cover items that are found within the RTL proof core 106B relative to all of the cover items in the coverage model. For example, the coverage metric can be computed to be "40% coverage." Higher coverage metrics indicate a better level of coverage, whereas lower coverage metrics indicate a lower level of coverage. The coverage can also be computed in other ways that represent a relationship between the subset of cover items that are covered by the RTL proof core 106B and all of the cover items. For example, the coverage metric can be a ratio of "4/10 cover items met."

Three different types of coverage models 214 are shown in FIG. 2: a statement coverage model 214-1, a branch coverage model 214-2, and an expression coverage model 214-3. In other embodiments, other coverage models are also possible even though not shown in FIG. 2. The coverage metric module 208 can select from any of the coverage models 214 when generating the coverage metrics.

Statement coverage model 214-1 can include cover items in the form of one or more of the code statements in the RTL representation 102B of the circuit design. When statement coverage model 214-1 is used, the coverage metric module 208 generates a statement coverage metric that represents a level of statement coverage provided by the RTL proof core 106B. Different variations of statement coverage models 214-1 are possible. Some statement coverage models 214-1 only include assignment statements from the RTL representation 102B. Referring to FIG. 1B, assignment statements are found in lines 012, 015, 017, 018, 019, and 021 for a total of six assignment statements. An assignment coverage metric generated for the proof core 106B would thus be "3/6" assignment statements covered. Other statement coverage models 214-1 may include all of the statements in the RTL representation 102B. Branch coverage model 214-2 can include all of the branches in the RTL description 102B of the circuit design. When branch coverage model 214-2 is used, the coverage metric module 208 generates a branch coverage metric that represents a level of branch coverage provided by the RTL proof core 106B. For example, the branch coverage metric can be a percentage of code branches found within the RTL proof core 106B relative to all code branches within the RTL description 102B.

Expression coverage model 214-3 can include expression cover items for logic expressions and sub-expressions in the RTL description 102B of the circuit design. Expression coverage model 214-3 can be used to identify logic expressions and sub-expressions in the design and to create expression cover items for each expression. For example if the expression of the form A&B, then there are three cover items: A, B, and A&B. The cover items are then used to generate an expression coverage metric that represents a level of expression coverage provided by the RTL level proof core 106B. For example, the branch coverage metric can be a percentage of the expression cover items found within the RTL level proof core 106B.

Statement model puts all statements in coverage model. They cover statements in COI to all statements. We identifying list of cover items within the proof core.

The presentation module 210 presents the coverage metric in a display so that the coverage metric can be viewed by a circuit designer. The circuit designer can then evaluate whether the amount of coverage provided by the tested properties is sufficient. If the coverage is not sufficient, the circuit designer may add additional properties to increase the level of coverage and then re-run the verification process to update the coverage metric.

Figure 3:
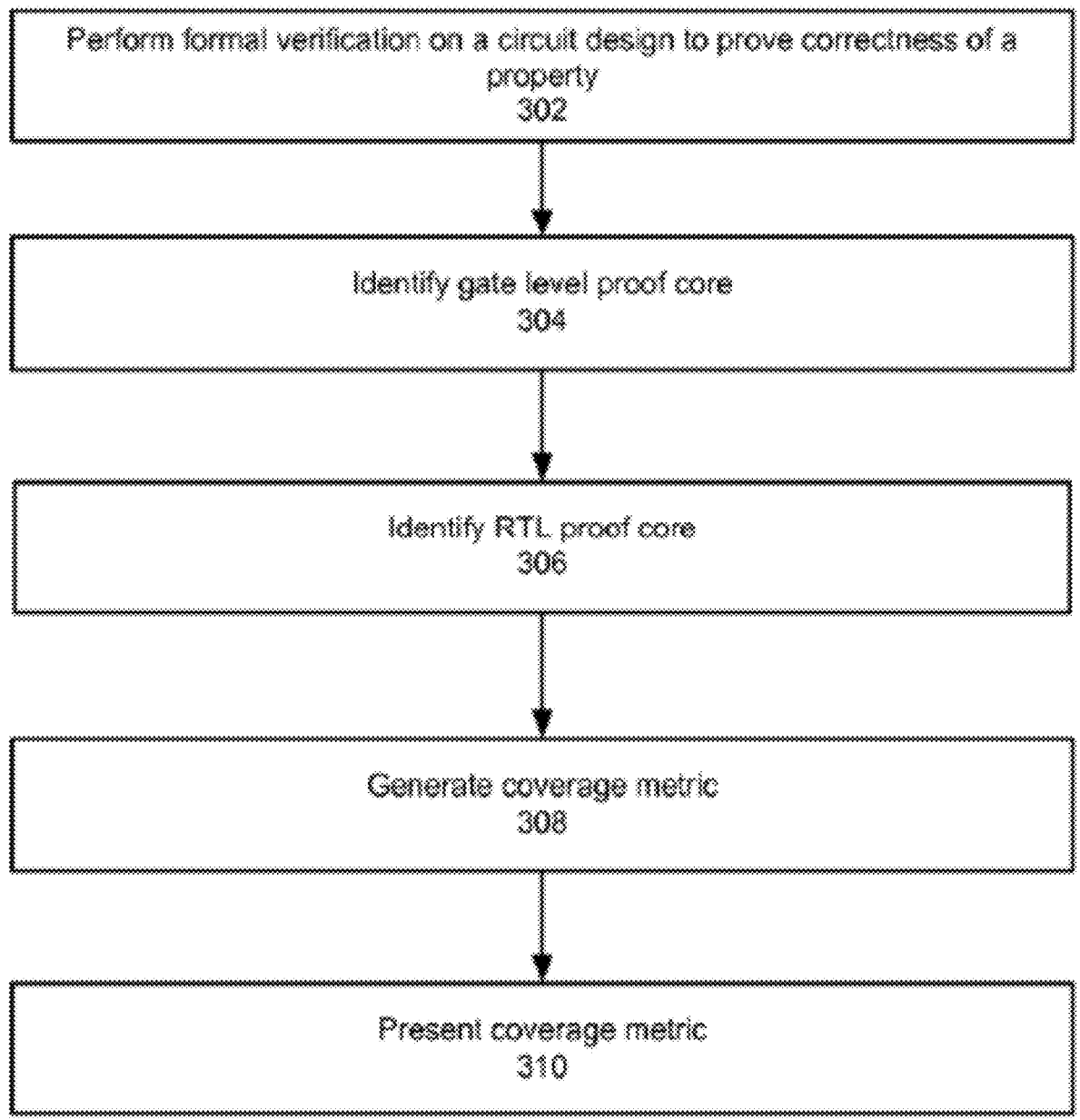
FIG. 3 is a method for evaluating formal verification coverage of a circuit design, according to an embodiment.

FIG. 3 is a method for evaluating formal verification coverage of a circuit design, according to an embodiment. In one embodiment, the method of FIG. 3 is performed by the modules of FIG. 2.

In step 302, a formal verification is performed on a circuit design to prove a correctness of a property of the circuit design. The circuit design has a COI 104 that represents a portion of the circuit design capable of affecting signals of the property. In step 304, a gate level proof core 106A is identified. In step 306, a RTL level proof core 106B is identified from the gate level proof core 106A. Both proof cores 106A and 106B are a portion of the COI 104 that is sufficient to prove the correctness of the property P during formal verification.

In step 308, a coverage metric is generated that is indicative of a level of formal verification coverage provided by the property. This coverage metric is generated from the RTL level proof core 106B. Different coverage models, such as statement coverage model 214-1, branch coverage model 214-2, and expression coverage model 214-3, can be selected for generating the coverage metric that result in different types of coverage metrics. In step 310, the coverage metric 310 is presented in a display, which can then be viewed by a circuit designer to determine whether the level of formal verification coverage is sufficient or whether more properties are needed.

Formal verification provides functional verification with a set of user properties, but that doesn't provide data on how much of the design is exercised by the model checking engine. As discussed above, some systems may provide a design's information based on the un-sat core generated by the model checking engine. But this information is only at a level of design signals and for a user this is merely an approximation about the design exercised. Typically, the user wants more precise data in terms of well-defined code coverage models, like block, branch, expression.

Referring also to FIG. 4, an embodiment depicting a formal coverage report reflecting model checking and un-sat core results is provided. In this example, the property 'COI_PROP' will be proven by the model checking (mc) engine. In operation, the mc engine may provide the un-sat core based on the automation of the problem modeled for it. In this particular case the design automation has a flop ("action") and few gates. It should be noted that the engine may perform a great deal of optimization for gates and as such they may not be able to retain all of the gates as would be seen using RTL, however, latch and flops may be retained. Hence, the un-sat core data is delivered in this retainable set, for example, in this case the flop "action" may be provided from un-sat core.

Referring also to FIG. 5, an embodiment depicting a more accurate formal coverage report reflecting model checking and un-sat core results is provided. It should be noted that a user may not be interested in how un-sat core data is maintained internally. The user may just be focused upon obtaining fully accurate code coverage with respect to their assertion. This accuracy provides the user with confidence that the entire design is exercised when a property is verified. For example, in the design of FIG. 5 the expectation is that the design exercised is only line 8 for the property. Here, the property may be triggered only in light1==2'b01 case. Changing the values of assignment in the other branch doesn't change property status.

Figure 6:
FIG. 6 is a diagram depicting a formal coverage report in accordance with an embodiment of the present disclosure.

Referring also to FIG. 6, an embodiment depicting a possible solution to the above problem is provided. For example, a possibility involves changing how the un-sat core performs optimization and save all the data as it is kept in the original design. However, there are significant drawbacks to this approach, basic un-sat performance will be affected and it will take years to develop new rules in un-sat core development.

Referring also to FIG. 7, an embodiment depicting a possible solution to the above problem is provided. For example, the user may be required to write every piece of his RTL in terms of unique design elements so that current un-sat core data satisfies the requirement. This is again very tedious and suboptimal. Designs are written to minimize design elements for several reasons. FIG. 7 shows a modified design with new elements, which the un-sat core will report only if these are exercised.

Figure 8:
FIG. 8 is a diagram depicting a formal coverage report in accordance with an embodiment of the present disclosure.

Referring also to FIGS. 8-9, embodiments depicting a possible solution to the above problem is provided. For example, a user may prune part of RTL that they believe may not be required for verification. If the property still passes the user can be sure that pruned part is not needed. However, if the property fails then that part is required. In FIG. 9, the highlighted portion is needed as property and will fail if it is pruned from the RTL. This is again a very tedious and time consuming task.

Referring now to FIGS. 10-17, embodiments of coverage improvement process are provided. The present disclosure may be configured to address the requirement to provide accurate formal coverage using current un-sat core data (e.g., from signal level to new code coverage models, like branch, expression, etc.). Embodiments of coverage improvement process may provide the best accuracy of formal coverage for properties at level of any code coverage model. The present disclosure may leverage how sat-solvers work on a given model. As such, embodiments included herein may be configured to modify the original model in such a way that, new modeling will be functionally same to original problem but will have extra elements at accuracy points. When a sat-solver looks at a new model it generates an un-sat core in terms of additional elements that are introduced. These accuracy points are decided based on level of granularity we are looking to provide accuracy to the formal coverage. These can be introduced at branch level, expression level, gate level, etc. Embodiments included herein show the new model, un-sat core provided by the sat-solver and its mapping to code coverage items.

In some embodiments, coverage improvement process may be configured to automatically identify code coverage points from a netlist of the original model. Additionally and/or alternatively, coverage improvement process may introduce logic using new elements and old assignments using results from un-sat core to show code coverage information for debugging.

For example, and referring again to FIG. 4, the new elements may be introduced for all of the branches and the new design looks like FIG. 10. In some embodiments, the sat-solver engine may report only those new elements that are from a branch exercised for property verification. As such, embodiments of coverage improvement process may exploit how the sat-solver works internally without exposing any details to user.

FIG. 10 shows the modeling performed at branch and statement level of accuracy points. The new elements are made in such a way that these are simple in logic (e.g., no extra overhead for sat-solvers) and may not be optimized. It should be noted that the highlighted code shows that sat-solver only exercised 2 elements for property "COI_PROP". The new element named "line_9_elem" is hinting that only one branch logic is required in case-construct below.

Figure 11:
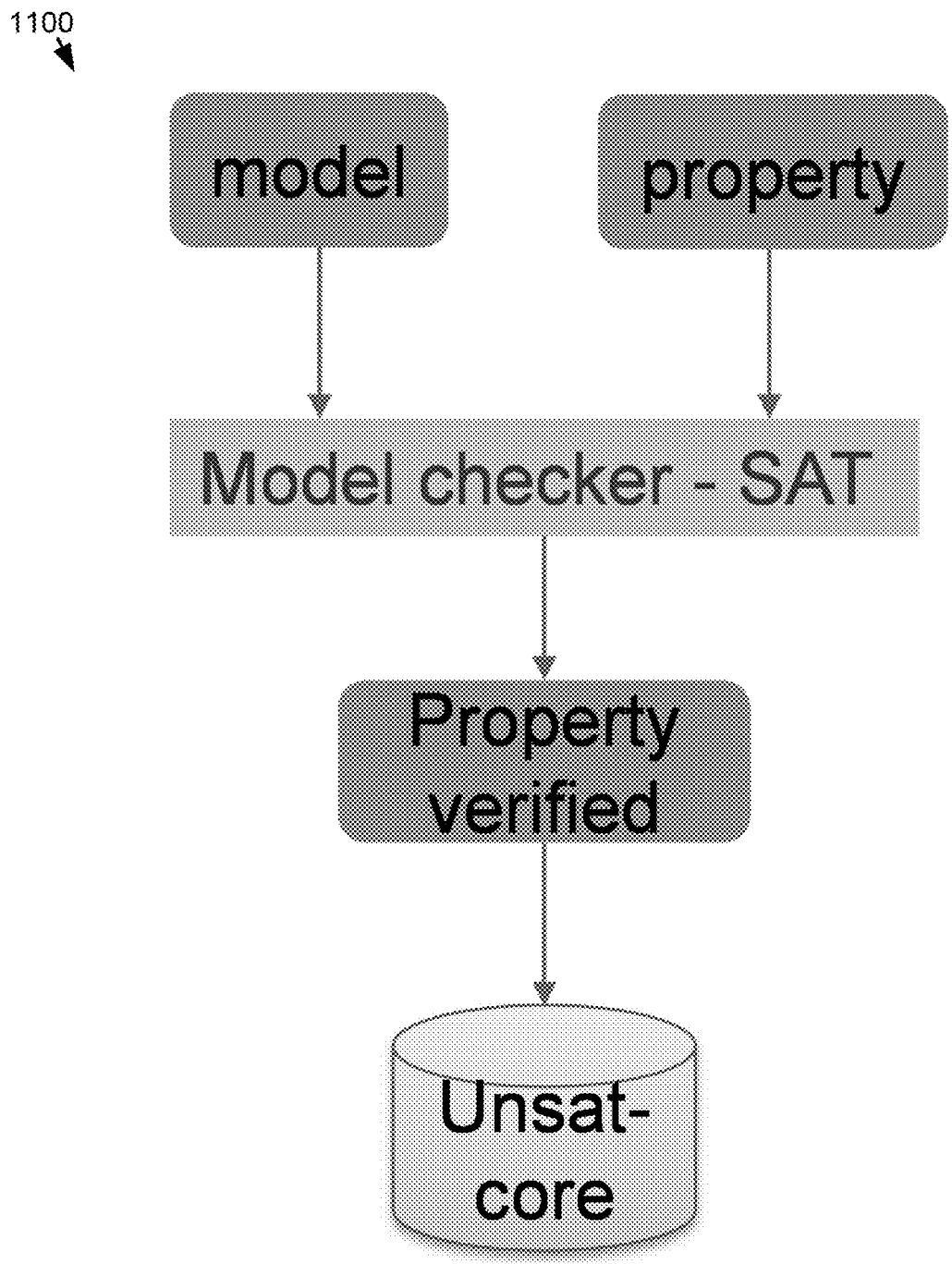
FIG. 11 is a diagram depicting an embodiment in accordance with the present disclosure.
Figure 12:
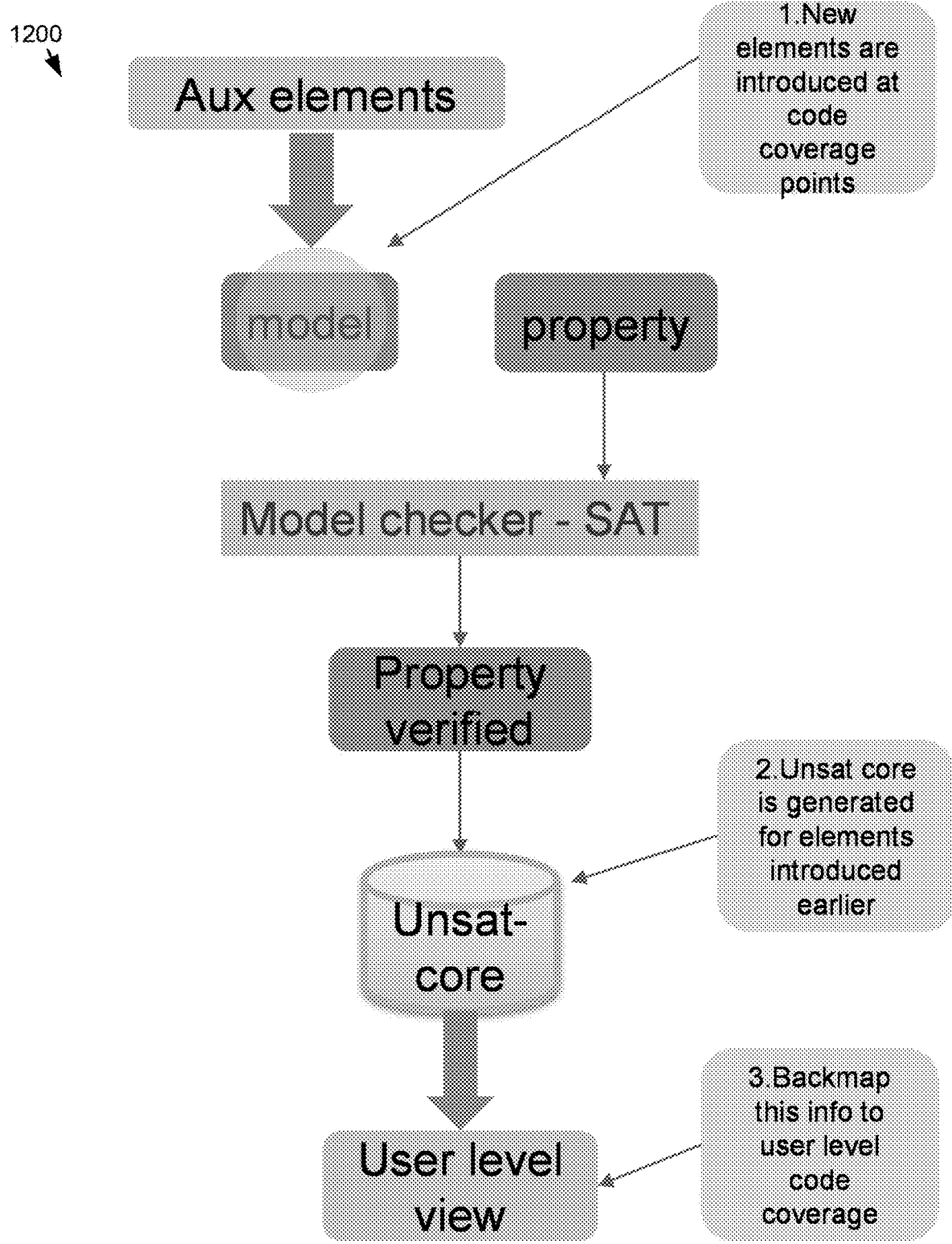
FIG. 12 is a diagram depicting an embodiment in accordance with the present disclosure.

Referring now to FIGS. 11-12, embodiments of a prior flow where the unsat core is extracted at the signal level and embodiments of the coverage improvement process included herein are provided. FIG. 12, for example, shows the extraction of an unsat core at the code level.

In some embodiments, and referring also to FIG. 13, the data generated by the sat-solver with under the hood modelling is on internal signals. Accordingly, there is no correlation of these in actual design as such. As such, the correlation between the new element and code coverage model is also a very important feature. In this example, branches (e.g., highlighted in yellow) may be mapped back from the internal nets in terms of user understandable semantics (e.g., code coverage elements, source highlight, etc).

Figure 14:
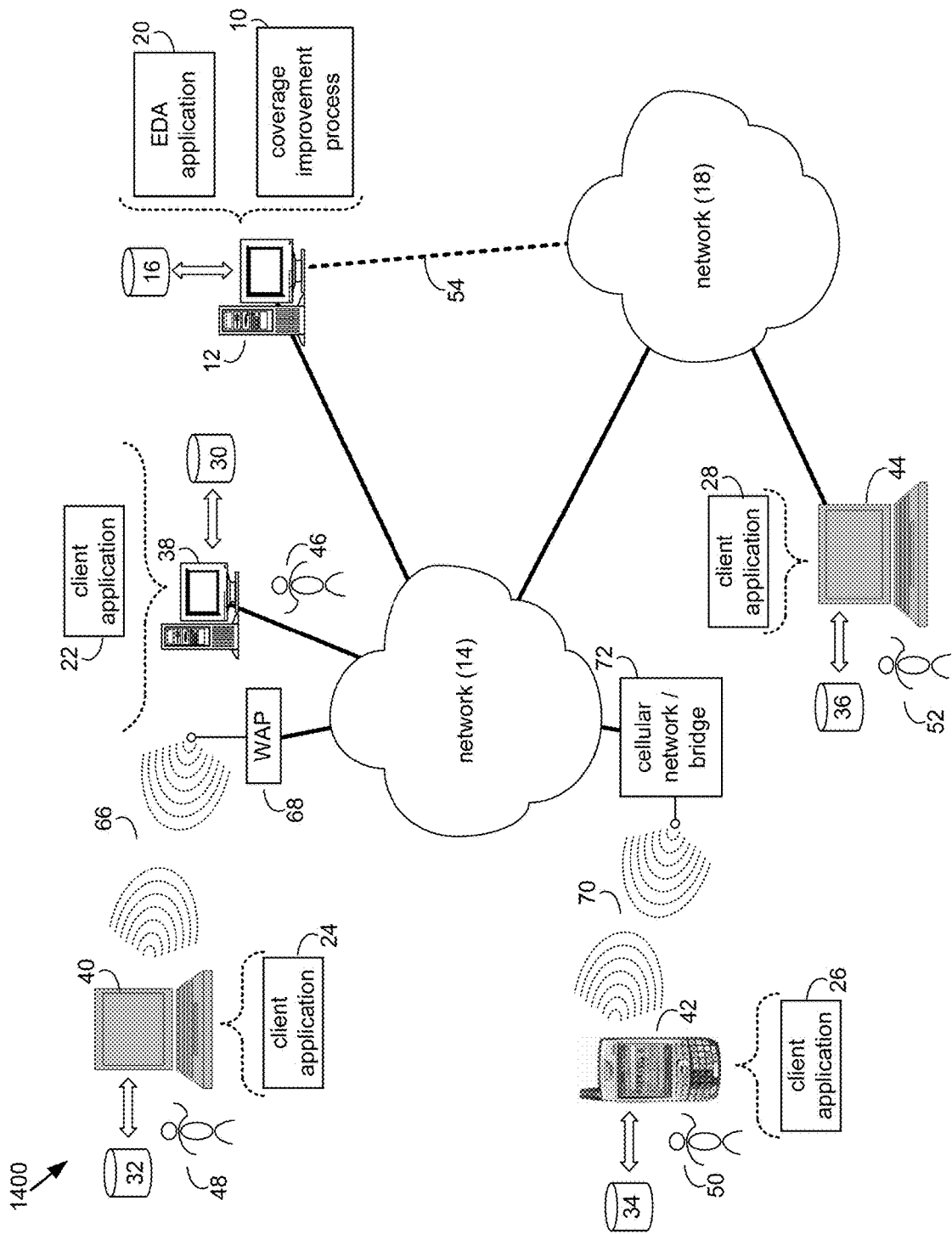
FIG. 14 is a diagram depicting an embodiment in accordance with the present disclosure.

Referring to FIG. 14, there is shown a coverage improvement process 10 that may reside on and may be executed by server computer 12, which may be connected to network 14 (e.g., the Internet or a local area network). Examples of server computer 12 may include, but are not limited to: a personal computer, a server computer, a series of server computers, a mini computer, and a mainframe computer. Server computer 12 may be a web server (or a series of servers) running a network operating system, examples of which may include but are not limited to: Microsoft® Windows® Server; Novell® NetWare®; or Red Hat® Linux®, for example. (Microsoft and Windows are registered trademarks of Microsoft Corporation in the United States, other countries or both; Novell and NetWare are registered trademarks of Novell Corporation in the United States, other countries or both; Red Hat is a registered trademark of Red Hat Corporation in the United States, other countries or both; and Linux is a registered trademark of Linus Torvalds in the United States, other countries or both.) Additionally/alternatively, coverage improvement process 10 may reside on and be executed, in whole or in part, by a client electronic device, such as a personal computer, notebook computer, personal digital assistant, or the like.

The instruction sets and subroutines of coverage improvement process 10, which may include one or more software modules, and which may be stored on storage device 16 coupled to server computer 12, may be executed by one or more processors (not shown) and one or more memory modules (not shown) incorporated into server computer 12. Storage device 16 may include but is not limited to: a hard disk drive; a solid state drive, a tape drive; an optical drive; a RAID array; a random access memory (RAM); and a read-only memory (ROM). Storage device 16 may include various types of files and file types including but not limited, to hardware description language (HDL) files, which may contain the port type descriptions and executable specifications of hardware blocks.

Server computer 12 may execute a web server application, examples of which may include but are not limited to: Microsoft IIS, Novell Webserver™, or Apache® Webserver, that allows for HTTP (i.e., HyperText Transfer Protocol) access to server computer 12 via network 14 (Web server is a trademark of Novell Corporation in the United States, other countries, or both; and Apache is a registered trademark of Apache Software Foundation in the United States, other countries, or both). Network 14 may be connected to one or more secondary networks (e.g., network 18), examples of which may include but are not limited to: a local area network; a wide area network; or an intranet, for example.

Server computer 12 may execute an electronic design automation (EDA) application (e.g., EDA application 20), examples of which may include but are not limited to those available from the assignee of the present application. EDA application 20 may interact with one or more EDA client applications (e.g., EDA client applications 22, 24, 26, 28) for electronic design optimization.

Coverage improvement process 10 may be a stand alone application, or may be an applet/application/script that may interact with and/or be executed within EDA application 20. In addition/as an alternative to being a server-side process, coverage improvement process 10 may be a client-side process (not shown) that may reside on a client electronic device (described below) and may interact with an EDA client application (e.g., one or more of EDA client applications 22, 24, 26, 28). Further, coverage improvement process 10 may be a hybrid server-side/client-side process that may interact with EDA application 20 and an EDA client application (e.g., one or more of client applications 22, 24, 26, 28). As such, coverage improvement process 10 may reside, in whole, or in part, on server computer 12 and/or one or more client electronic devices.

The instruction sets and subroutines of EDA application 20, which may be stored on storage device 16 coupled to server computer 12 may be executed by one or more processors (not shown) and one or more memory modules (not shown) incorporated into server computer 12.

The instruction sets and subroutines of EDA client applications 22, 24, 26, 28, which may be stored on storage devices 30, 32, 34, 36 (respectively) coupled to client electronic devices 38, 40, 42, 44 (respectively), may be executed by one or more processors (not shown) and one or more memory modules (not shown) incorporated into client electronic devices 38, 40, 42, 44 (respectively). Storage devices 30, 32, 34, 36 may include but are not limited to: hard disk drives; solid state drives, tape drives; optical drives; RAID arrays; random access memories (RAM); read-only memories (ROM), compact flash (CF) storage devices, secure digital (SD) storage devices, and a memory stick storage devices. Examples of client electronic devices 38, 40, 42, 44 may include, but are not limited to, personal computer 38, laptop computer 40, mobile computing device 42 (such as a smart phone, netbook, or the like), notebook computer 44, for example. Using client applications 22, 24, 26, 28, users 46, 48, 50, 52 may access EDA application 20 and may allow users to e.g., utilize coverage improvement process 10.

Users 46, 48, 50, 52 may access EDA application 20 directly through the device on which the client application (e.g., client applications 22, 24, 26, 28) is executed, namely client electronic devices 38, 40, 42, 44, for example. Users 46, 48, 50, 52 may access EDA application 20 directly through network 14 or through secondary network 18. Further, server computer 12 (i.e., the computer that executes EDA application 20) may be connected to network 14 through secondary network 18, as illustrated with phantom link line 54.

The various client electronic devices may be directly or indirectly coupled to network 14 (or network 18). For example, personal computer 38 is shown directly coupled to network 14 via a hardwired network connection. Further, notebook computer 44 is shown directly coupled to network 18 via a hardwired network connection. Laptop computer 40 is shown wirelessly coupled to network 14 via wireless communication channel 66 established between laptop computer 40 and wireless access point (i.e., WAP) 68, which is shown directly coupled to network 14. WAP 68 may be, for example, an IEEE 802.11a, 802.11b, 802.11g, Wi-Fi, and/or Bluetooth device that is capable of establishing wireless communication channel 66 between laptop computer 40 and WAP 68. Mobile computing device 42 is shown wirelessly coupled to network 14 via wireless communication channel 70 established between mobile computing device 42 and cellular network/bridge 72, which is shown directly coupled to network 14.

As is known in the art, all of the IEEE 802.11x specifications may use Ethernet protocol and carrier sense multiple access with collision avoidance (i.e., CSMA/CA) for path sharing. The various 802.11x specifications may use phase-shift keying (i.e., PSK) modulation or complementary code keying (i.e., CCK) modulation, for example. As is known in the art, Bluetooth is a telecommunications industry specification that allows e.g., mobile phones, computers, and personal digital assistants to be interconnected using a short-range wireless connection.

Client electronic devices 38, 40, 42, 44 may each execute an operating system, examples of which may include but are not limited to Microsoft Windows, Microsoft Windows CE®, Red Hat Linux, or other suitable operating system. (Windows CE is a registered trademark of Microsoft Corporation in the United States, other countries, or both).

Figure 15:
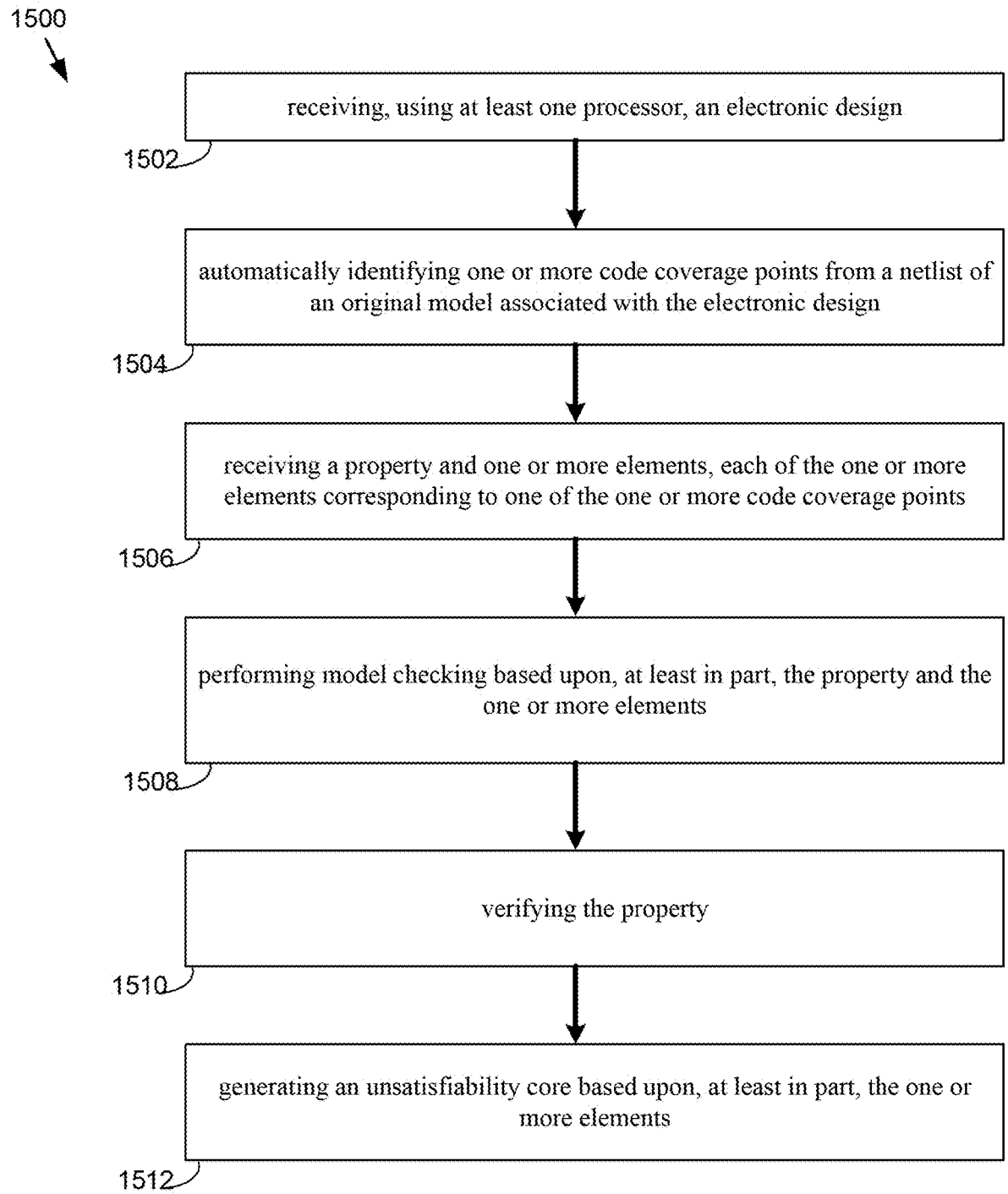
FIG. 15 is a diagram depicting an embodiment in accordance with the present disclosure.

Referring now to FIG. 15, an exemplary flowchart 1500 depicting operations consistent with coverage improvement process 10 is provided. Operations may include receiving (1502), using at least one processor, an electronic design and automatically identifying (1504) one or more code coverage points from a netlist of an original model associated with the electronic design. Operations may include receiving (1506) a property and one or more elements, each of the one or more elements corresponding to one of the one or more code coverage points. Operations may further include performing (1508) model checking based upon, at least in part, the property and the one or more elements. Operations may also include verifying (1510) the property and generating (1512) an unsatisfiability core based upon, at least in part, the one or more elements.

The foregoing description of the embodiments of the disclosure has been presented for the purpose of illustration; it is not intended to be exhaustive or to limit the embodiments to the precise forms disclosed. Persons skilled in the relevant art can appreciate that many modifications and variations are possible in light of the above disclosure.

Some portions of this description describe the embodiments of the disclosure in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. Furthermore, it has also proven convenient at times, to refer to these arrangements of operations as modules, without loss of generality. The described operations and their associated modules may be embodied in software, firmware, hardware, or any combinations thereof.

Any of the steps, operations, or processes described herein may be performed or implemented with one or more hardware or software modules, alone or in combination with other devices. In one embodiment, a software module is implemented with a computer program product comprising a non-transitory computer-readable medium containing computer program code, which can be executed by a computer processor for performing any or all of the steps, operations, or processes described.

Embodiments of the disclosure may also relate to an apparatus for performing the operations herein. This apparatus may be specially constructed for the required purposes, and/or it may comprise a general-purpose computing device selectively activated or reconfigured by a computer program stored in the computer. Such a computer program may be stored in a tangible computer readable storage medium or any type of media suitable for storing electronic instructions, and coupled to a computer system bus. Furthermore, any computing systems referred to in the specification may include a single processor or may be architectures employing multiple processor designs for increased computing capability.

Finally, the language used in the specification has been principally selected for readability and instructional purposes, and it may not have been selected to delineate or circumscribe the inventive subject matter. It is therefore intended that the scope of the disclosure be limited not by this detailed description, but rather by any claims that issue on an application based hereon. Accordingly, the disclosure of the embodiments is intended to be illustrative, but not limiting, of the scope of the disclosure, which is set forth in the following claims.

It will be apparent to those skilled in the art that various modifications and variations can be made in the embodiments of the present disclosure without departing from the spirit or scope of the present disclosure. Thus, it is intended that embodiments of the present disclosure cover the modifications and variations provided they come within the scope of the appended claims and their equivalents.

What is claimed is:

1. A computer-implemented method for electronic design verification comprising:
    receiving, using at least one processor, an electronic design;
    automatically identifying, using at least one processor, one or more code coverage points from a netlist of an original model associated with the electronic design;
    modifying the original model to generate a new model, wherein modifying the original model to generate a new model includes receiving a property and adding one or more new elements, using at least one processor, each of the one or more new elements corresponding to one of the one or more code coverage points;
    performing model checking on the new model, using at least one processor, based upon, at least in part, the property and the one or more new elements;
    verifying the property, using at least one processor;
    generating an unsatisfiability core, using at least one processor, based upon, at least in part, the one or more new elements, wherein the unsatisfiability core is a subset of a conjunctive normal form representation of the electronic design; and
    backmapping information from the unsatisfiability core to a user-viewable display.

2. The computer-implemented method of claim 1, wherein the one or more new elements are at a branch level.

3. The computer-implemented method of claim 1, wherein the one or more new elements are at an expression level.

4. The computer-implemented method of claim 1, wherein the one or more new elements are at a gate level.

5. The computer-implemented method of claim 1, wherein the one or more new elements are at a block level.

6. The computer-implemented method of claim 1, further comprising:
    displaying at least a portion of the unsatisfiability core at a graphical user interface; and
    linking at least a portion of the unsatisfiability core with the one or more code coverage points.

7. A computer-readable storage medium for electronic design verification, the computer-readable storage medium having stored thereon instructions that when executed by a machine result in one or more operations, the operations comprising:
- receiving, using at least one processor, an electronic design;
- automatically identifying, using at least one processor, one or more code coverage points from a netlist of an original model associated with the electronic design;
- modifying the original model to generate a new model, wherein modifying the original model to generate a new model includes receiving a property and adding one or more new elements, using at least one processor, each of the one or more new elements corresponding to one of the one or more code coverage points;
- performing model checking on the new model, using at least one processor, based upon, at least in part, the property and the one or more new elements;
- verifying the property, using at least one processor; and
- generating an unsatisfiability core, using at least one processor, based upon, at least in part, the one or more new elements, wherein the unsatisfiability core is a subset of a conjunctive normal form representation of the electronic design; and
- backmapping information from the unsatisfiability core to a user-viewable display.

8. The computer-readable storage medium of claim 7, wherein the one or more new elements are at a branch level.

9. The computer-readable storage medium of claim 7, wherein the one or more new elements are at an expression level.

10. The computer-readable storage medium of claim 7, wherein the one or more new elements are at a gate level.

11. The computer-readable storage medium of claim 7, wherein the one or more new elements are at a block level.

12. The computer-readable storage medium of claim 7, further comprising:
- displaying at least a portion of the unsatisfiability core at a graphical user interface; and
- linking at least a portion of the unsatisfiability core with the one or more code coverage points.

13. A system for electronic design verification comprising:
- a computing device having at least one processor configured to receive an electronic design and automatically identify one or more code coverage points from a netlist of an original model associated with the electronic design, the at least one processor further configured to modify the original model to generate a new model, wherein modifying the original model to generate a new model includes receiving a property and adding one or more new elements, each of the one or more new elements corresponding to one of the one or more code coverage points, the at least one processor configured to perform model checking on the new model based upon, at least in part, the property and the one or more new elements, the at least one processor further configured to verify the property and generate an unsatisfiability core based upon, at least in part, the one or more new elements, wherein the unsatisfiability core is a subset of a conjunctive normal form representation of the electronic design, the at least one processor further configured to backmap information from the unsatisfiability core to a user-viewable display.

14. The system of claim 13, wherein the one or more new elements are at a branch level.

15. The system of claim 14, wherein the one or more new elements are at an expression level.

16. The system of claim 13, wherein the one or more new elements are at a gate level.

17. The system of claim 16, wherein the one or more new elements are at a block level.

18. The system of claim 13, wherein the at least one processor is further configured to display at least a portion of the unsatisfiability core at a graphical user interface.

* * * * *